US006583027B2

(12) United States Patent
Ota et al.

(10) Patent No.: US 6,583,027 B2
(45) Date of Patent: Jun. 24, 2003

(54) MANUFACTURING METHOD OF SEMICONDUCTOR DEVICE AND DESIGNING METHOD OF SEMICONDUCTOR DEVICE

(75) Inventors: Noriyuki Ota, Tokyo (JP); Nobuyuki Katsuki, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/024,157

(22) Filed: Dec. 18, 2001

(65) Prior Publication Data

US 2002/0168833 A1 Nov. 14, 2002

(30) Foreign Application Priority Data

Dec. 26, 2000 (JP) ....................................... 2000-395686

(51) Int. Cl.[7] ................................................ H01L 21/76

(52) U.S. Cl. ........................ 438/424; 438/427; 438/690; 438/692

(58) Field of Search ................................ 438/424, 427, 438/690, 691, 692, 693

(56) References Cited

U.S. PATENT DOCUMENTS 5,976,949 A * 11/1999 Chen .......................... 438/427
6,045,435 A * 4/2000 Bajaj et al. ................. 438/692
6,057,210 A * 5/2000 Yang et al. ................. 438/427
6,232,231 B1 * 5/2001 Sethuraman et al. ........ 438/691
6,291,870 B1 9/2001 Kawashima et al.
6,352,928 B2 * 3/2002 Tsutsui ....................... 438/692
6,380,087 B1 * 4/2002 Gupta et al. ................ 438/692
6,436,809 B1 * 8/2002 Kwag et al. ................ 438/631
6,461,932 B1 * 10/2002 Wang ......................... 438/424
6,462,428 B2 * 10/2002 Iwamatsu ................... 257/797

FOREIGN PATENT DOCUMENTS

| | | |
|---|---|---|
| JP | 09-107028 | 4/1997 |
| JP | 09-266192 | 10/1997 |
| JP | 10-092921 | 4/1998 |
| JP | 2000-349143 | 12/2000 |

* cited by examiner

*Primary Examiner*—Kevin M. Picardat
(74) *Attorney, Agent, or Firm*—Katten Muchin Zavis Rosenman

(57) ABSTRACT

When a top surface area for a plurality of dummy patterns 13 and a width for a plurality of trenches 12 are set on the basis of a ratio (an occupation density of the film for polishing in an adjacent region 10) of a total top surface area for raised sections of the film for polishing to a horizontally projected area of the adjacent region 10, it is possible to suppress dishing and erosion and thereby attain a high planarity when a film for polishing is formed on a semiconductor substrate, wherein dummy patterns 13 partitioned by a plurality of trenches 12 are disposed in an element isolation region 11, and planarization by the CMP is applied thereto.

13 Claims, 9 Drawing Sheets

(c)

(a)

(b)

MANUFACTURING METHOD OF SEMICONDUCTOR DEVICE AND DESIGNING METHOD OF SEMICONDUCTOR DEVICE

BACKGROUND OF THE INVENTION

The present invention relates to a method of manufacturing and a method of designing a semiconductor device which provide chemical mechanical polishing capable to attain an excellent planarity for the polished surface, and more particularly to a method of fabricating a buried trench structure.

For the purpose of achieving a higher integration in a semiconductor device, a conventional method such as the LOCOS (LOCal Oxidation of Silicon) method is often applied to the formation of an element isolation region. However, there are known instances where such a method cannot achieve satisfactory electrical isolation between elements. As a method of fabricating an element isolation region to replace the LOCOS method, the Shallow Trench Isolation method (referred to as the STI hereinafter) has been, thereupon, put into practical use.

In the STI, a trench is formed in a semiconductor substrate and then an insulating material film is grown so as to fill up the trench. Subsequently, by the chemical mechanical polishing (referred to as the CMP hereinafter) method, the insulating material film present in the area other than the inside of the trench is removed and thereby a buried trench structure filled up with the insulating material is fabricated.

FIG. 6 shows an example of a layout in which a memory cell region 75 which is provided with a plurality of memory cell formation regions 77 partitioned by a plurality of trenches and an adjacent region 70 which is provided with adjacent element formation regions 74. partitioned by an element isolation region 71 are disposed. Further, FIG. 7 illustrates a method of manufacturing a semiconductor device having such a layout as shown in FIG. 6. First, s shown in FIG. 7(*a*), a trench 79 with a large width is formed in the element isolation region 71. Next, as shown in FIG. 7(*b*), a film for polishing 78 is grown from an isolating material to fill up the trench 79. The film for polishing present in the area other than the inside of the trench 79 is then removed by the CMP, and thereby an element isolation region made of a buried trench structure with a large width, being filled up with an insulating material, is formed.

However, with the layout shown in FIG. 6, when the growth of the film for polishing 78 is completed and the CMP starts, although, in the memory cell region 75, the film for polishing comes into contact with a polishing pad with a large area, in the adjacent region 70, a contact area between the film for polishing and the polishing pad is small. Since the polishing rate becomes low for the section where a large area of the film for polishing is in contact with the polishing pad, and high for the section where only a small area thereof is in contact therewith, the difference between the polishing rates may cause a considerable deviation in polishing. Because of this, after the completion of the CMP, dishing, erosion and the like may be left on the substrate surface, as shown in FIG. 7(*c*), unable to attain satisfactory planarity. Dishing, as used herein, indicates a state that the insulating material in the trench becomes polished so that the center of the insulating material within the trench falls in. On the other hand, erosion, as used herein, indicates a state that the polishing over the entire region proceeds excessively and the surface of the entire region falls in.

To avoid these adverse effects, various investigations have been made so far and, for example, formation of a dummy pattern in the element formation region has been proposed.

For instance, in Japanese Patent Application Laid-open No. 107028/1997, it is disclosed that dishing can be prevented by setting a layout such as a dummy pattern that is identical to a pattern formed in a cell site is inserted into a field region with a wide trench, within the limit of not affecting the transistor performance, and making the height of the major part of the dummy pattern equal to that in the cell site immediately before the CMP. However, the method described in this publication is not very practical, because the pattern in the cell site is minutely formed and, thus, the insertion of a dummy pattern that is identical to that pattern into the field region greatly increases the amount of data in reticle fabrication.

Further, in Japanese Patent Application Laid-open No. 107028/1997, there is described a case in which a dummy pattern is not identical to a pattern in a cell region but comprising a line/space pattern that can diminish a difference in level between the cell site and dummy pattern site from the viewpoint of the CMP. Nevertheless, therein, it is not specifically described how to set a dummy pattern if the dummy pattern is not identical to the pattern in the cell region.

Further, in Japanese Patent Application Laid-open No. 92921/1998, it is disclosed that, by forming a pattern of dummy structure in a second region, a polishing rate of the second region is adjusted to become almost the same as a polishing rate of a first region, whereby dishing is prevented from occurring. In particular, an occupation density is defined as a ratio of an area occupied by the dummy structure in the first region to a total surface area of the first region therein. Further, it is described that the occupation density of the dummy structure should be adjusted to coincide well with the density of the structure which is present in the second region and preferably set to be 5–40%.

In effect, it is proposed, in this publication, that, as shown in FIG. 8, when a plurality of dummy patterns 83 partitioned by a plurality of trenches 82 are formed in an element isolation region 81, dummy patterns are designed on the basis of a ratio (referred to as an occupation density of dummy patterns hereinafter) of a total sum of top surface areas for a plurality of dummy patterns 83 to a horizontally projected area of an adjacent region 80. Presumably, such a designing method can, while preventing the amount of data from increasing unduly by setting the occupation density of dummy patterns within an appropriate range, fabricate dummy patterns 83 having an occupation density different from the one for a memory cell region 85, and thereby suppress dishing and erosion well.

However, there are instances where the substrate surface cannot attain satisfactory planarity even though dummy patterns having a prescribed occupation density are formed in the element isolation region.

Such a state is described, with reference to FIG. 9. First, as shown in FIG. 9(*a*), dummy patterns 83 partitioned by a plurality of first trenches 82 are fabricated in an element isolation region 81 within an adjacent region 80. Hereat, taking occupation densities of respective patterns for memory cell regions 87 and adjacent element formation regions 84 into consideration, an occupation density of dummy patterns 83 is made to have a prescribed value within the limit the resulting increase in amount of data is well controllable. Further, the occupation density of dummy patterns 83 can differ from the occupation density of memory cell formation regions 87, if required.

Next, as shown in FIG. 9(*b*), a film for polishing 88 is formed from an insulating material to fill up first trenches 82 and second trenches 86. However, since the film for polishing 88, in forming, grows not only on the top surfaces of the dummy patterns 83 but also on the sidewalls inside of first trenches 82, respective depositions for the film to lie on the dummy patterns 83 spread out horizontally to cover wider areas than underlying top surface areas of the dummy patterns. Therefore, even if the occupation density of the dummy patterns 83 has a prescribed value, a ratio (referred to as an occupation density of the film for polishing hereinafter) at which a total top surface area for raised sections of the film for polishing occupies the adjacent region 80 becomes different from the occupation density of the dummy patterns 83.

As a result, when the CMP starts, the occupation density of the film for polishing coming into contact with a polishing pad for the CMP differs from the occupation density of the dummy patterns and, thus, it becomes difficult to control the polishing manner such as the polishing rates of respective regions and the polishing rate ratios between regions in the CMP through the occupation density of the dummy patterns. In consequence, satisfactory planarity may not be attained, with dishing and erosion appearing, in completion of the CMP, on the substrate surface, as shown in FIG. 9(*c*), although dummy patterns 83 with a prescribed occupation density are formed in the element isolation region 81.

In spite of various investigations made to achieve a better planarity in the CMP by forming dummy patterns in the element isolation region, there still remains much room for improvement, as described above.

SUMMARY OF THE INVENTION

An object of the present invention is to create a novel method of designing dummy patterns that are to be formed in the element isolation region, and thereby suppress dishing and erosion in the CMP to attain a high planarity.

In light of the above problems, the present invention provides a method of manufacturing a semiconductor device; which comprises the steps of:

- forming a plurality of first trenches in a first region on a semiconductor substrate and thereby forming a plurality of dummy patterns that are partitioned by a plurality of said first trenches;
- forming a film for polishing at least on said first region so as to provide raised sections above a plurality of said dummy patterns and sunken sections above a plurality of said first trenches; and
- removing said film for polishing that overlies a plurality of said dummy patterns by means of polishing so that said film for polishing may remain inside of a plurality of said first trenches; wherein:
  - a top surface area for a plurality of said dummy patterns and a width for a plurality of said first trenches are set on the basis of a ratio of a total top surface area for raised sections of said film for polishing to a horizontally projected area of said first region.

Further, the present invention provides a method of manufacturing a semiconductor device comprising a memory cell region and an adjacent region which has an adjacent element formation region partitioned by an element isolation region; which comprises the steps of:

- forming a plurality of dummy patterns partitioned by a plurality of first trenches and a plurality of memory cell formation regions partitioned by a plurality of second trenches with a smaller width than a plurality of said first trenches, in said element isolation region and in said memory cell region, respectively;
- forming a film for polishing on said adjacent region and said memory cell region so as to provide raised sections above a plurality of said dummy patterns as well as said adjacent element formation region, and provide sunken sections above a plurality of said first trenches; and
- removing said film for polishing that overlies said adjacent region and said memory cell region by means of polishing so that said film for polishing may remain inside of a plurality of said first trenches as well as inside of a plurality of said second trenches; wherein:
  - a top surface area for a plurality of said dummy patterns and a width for a plurality of said first trenches are set on the basis of a ratio of a total top surface area for raised sections of said film for polishing above a plurality of dummy patterns as well as raised sections thereof above said adjacent element formation region to a horizontally projected area of said adjacent region.

Further, the present invention provides a method of designing a semiconductor device; which is manufactured by a method comprising the steps of:

- forming a plurality of first trenches in a first region on a semiconductor substrate and thereby forming a plurality of dummy patterns that are partitioned by a plurality of said first trenches;
- forming a film for polishing at least on said first region so as to provide raised sections above a plurality of said dummy patterns and sunken sections above a plurality of said first trenches; and
- removing said film for polishing that overlies a plurality of said dummy patterns by means of polishing so that said film for polishing may remain inside of a plurality of said first trenches; wherein:
  - a top surface area for a plurality of said dummy patterns and a width for a plurality of said first trenches are set on the basis of a ratio of a total top surface area for raised sections of said film for polishing to a horizontally projected area of said first region.

In the above-methods, dummy patterns are designed, taking account of not only the occupation density of dummy patterns but also, for the occupation density of the film for polishing, the actual shape of the film for polishing when polished. With this, it becomes possible to control the polishing manner such as the polishing rates of respective regions and the polishing rate ratios between regions in the CMP with high accuracy, and prevent dishing and erosion from occurring in the CMP. Accordingly, after completion of the CMP, a highly flat polishing surface can be obtained.

A trench with a large width, as used herein, refers to a trench in shape, viewed from the cross-section of the semiconductor substrate, and includes a trench having a large horizontally projected area as a plane figure.

As set for the above, when a film for polishing is formed on a semiconductor substrate wherein dummy patterns partitioned by a plurality of trenches are disposed in an element isolation region, and planarization by the CMP is applied thereto, a top surface area for a plurality of dummy patterns and a width for a plurality of trenches are set on the basis of a ratio (an occupation density of the film for polishing) of a total top surface area for raised sections of the film for polishing to a horizontally projected area of a first region, whereby dishing and erosion can be suppressed and a high planarity can be attained.

DETAILED DESCRIPTION

Preferred embodiments of the present invention are described in detail below.

Figure 1:
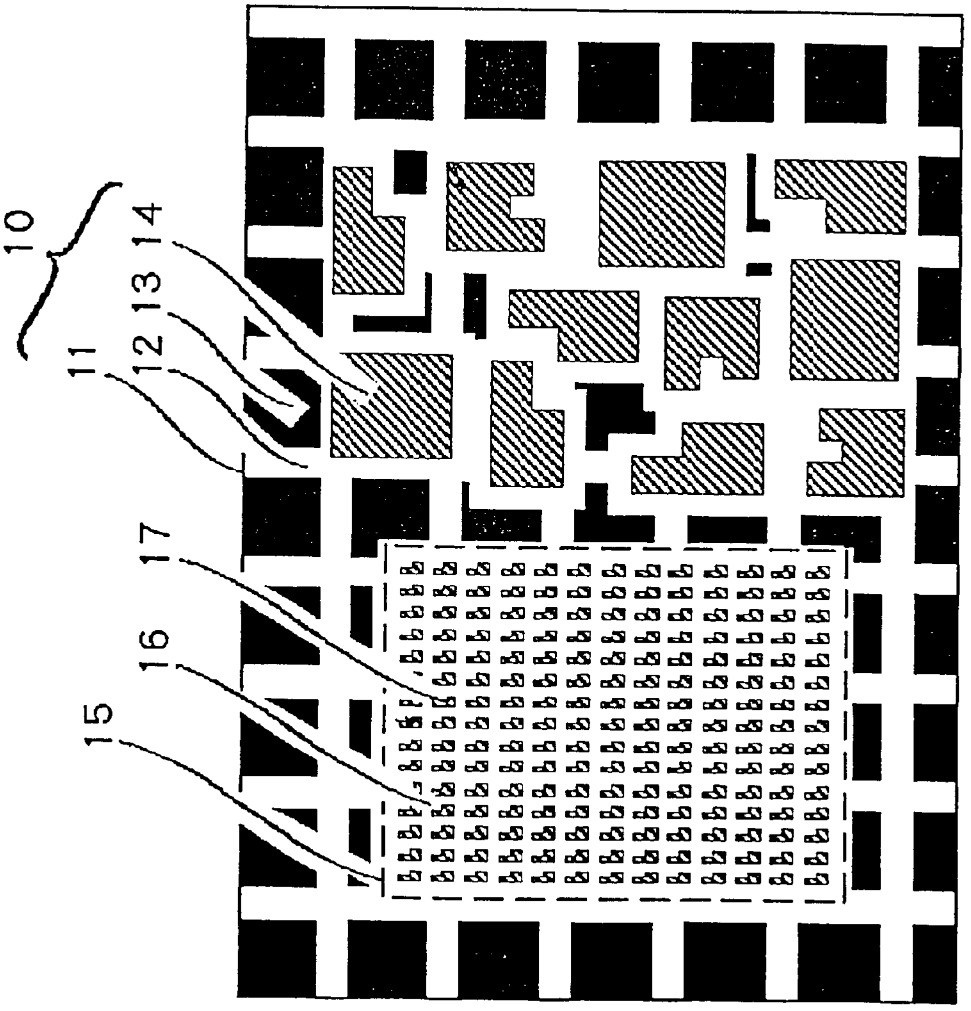
FIG. 1 is a schematic plan view in explaining a layout of elements on a semiconductor substrate according to the present invention.

FIG. 1 shows an example of an element layout for a semiconductor device manufactured according to the present invention. In a memory cell region (a second region) 15, a plurality of second trenches 16 that are to serve as an element isolation region are formed and, partitioned by a plurality of these second trenches 16, memory cell formation regions (second element formation regions) 17 are formed. Further, in an adjacent region (a first region) 10 that is another region other than the second region 15, a plurality of adjacent element formation regions (first element formation regions) 14 are disposed, being partitioned by an element isolation region 11. Further, in the element isolation region 11, partitioned by a plurality of first trenches 12, a plurality of dummy patterns are formed.

Figure 2:
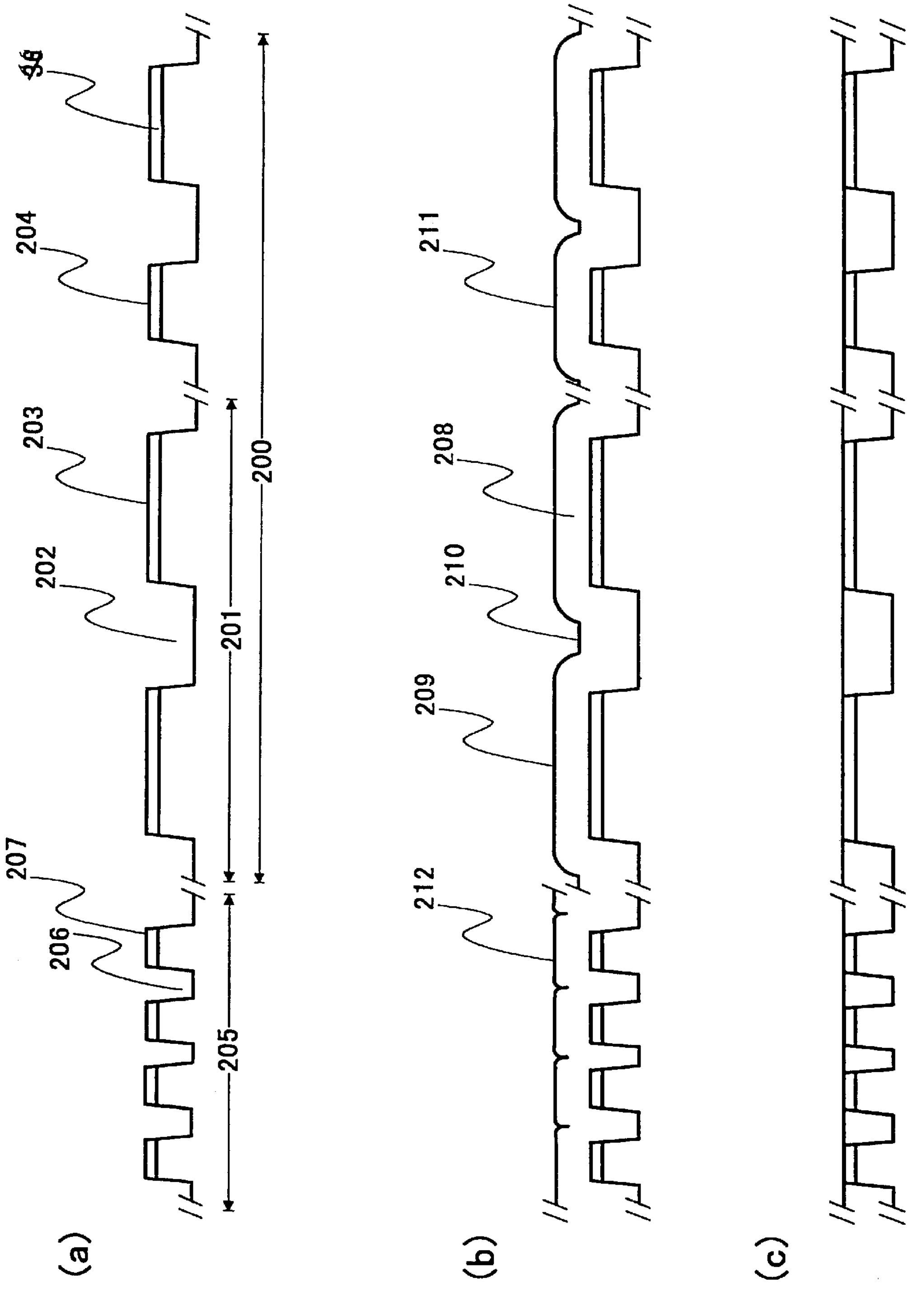
FIG. 2 is a series of schematic cross-sectional views illustrating the steps of a method of manufacturing a semiconductor substrate according to the present invention.

FIG. 2 illustrates the steps of a method of manufacturing a semiconductor device having such a layout as shown in FIG. 1.

First, as shown in FIG. 2(*a*), partitioned by a plurality of first trenches 202, a plurality of dummy patterns 203 are fabricated in an element isolation region 201 within a first region 200. Herein, a top surface area for a plurality of dummy patterns 203 and a width for a plurality of first trenches 202 are determined, in such a way that an occupation density of the dummy patterns 203 is taken into consideration, and besides an occupation density of raised sections 209 of a film for polishing 208 is made to have a prescribed value when formation of the film for polishing is completed.

Next, as shown in FIG. 2(*b*), a film for polishing 208 is formed from an insulating material so that raised sections 209 may be formed above a plurality of dummy patterns 203 and sunken sections 210, above a plurality of first trenches 202, filling up first trenches 202 with the insulating material. Since the film for polishing 208, hereat, grows not only on the top surfaces of the dummy patterns 203 and second element formation regions (memory cell formation regions) 207 but also on the sidewalls inside of first trenches 202 and inside of second trenches 206, respective depositions for the film on the dummy patterns 203 and second element formation regions (memory cell formation regions) 207 spread out horizontally to cover wider areas than underlying top surface areas thereof. Therefore, the top surface areas for raised sections 209 of the film for polishing laid over the dummy patterns become larger than the top surface areas for the dummy patterns.

Further, in a second region (a memory cell region) 205, as a width for the second trenches 206 is narrower than a width for the first trenches 202, extended portions of the film for polishing laid over neighbouring dummy patterns come into contact with each other over the second trenches 206 so that the top surfaces of the film for polishing 212 over the second region become almost plane-like. Consequently, in the second region (the memory cell region) 205, a ratio (an occupation density) at which top surface areas for raised sections of the film for polishing 212 occupy the second region (the memory cell region) 205 can be, in practice, considered as 100%.

Now, in the present invention, the dummy patterns 203 are designed in such a way that an occupation density of the dummy patterns 203 in the first region (the adjacent region) 200 is taken into consideration, and besides an occupation density of the raised sections 209 of the film for polishing above the dummy patterns 203 in the first region (the adjacent region) 200 is made to have a prescribed value. In short, the dummy patterns 203 are designed so that a difference between the occupation density of the film for polishing in the first region (the adjacent region) 200 and the occupation density of the film for polishing in the second region (the memory cell region) 205 may become small.

In this way, a difference between an area of the film for polishing over the second region (the memory cell region) 205 with which a polishing pad for the CMP comes into contact when the CMP starts and an area of the film for polishing over the first region (the adjacent region) 200 with which the polishing pad for the CMP comes into contact thereat can be made small.

Consequently, it becomes possible to control the polishing manner such as the polishing rates of respective regions and the polishing rate ratios between regions in the CMP with high accuracy, and suppress the deviation in polishing between the first region (the adjacent region) and the second region (the memory cell region), and, thus, prevent dishing, erosion and the like from appearing on the substrate surface in completion of the CMP. As a result, a high planarity as shown in FIG. 2(*c*) can be attained.

Further, considering that raised sections 211 of the film for polishing are also formed above first element formation regions (adjacent element formation regions) 204, it is preferable to determine the top surface areas for a plurality of dummy patterns 203 and the width for a plurality of first trenches 202 so that a ratio of the total sum of top surface areas for raised sections 209 of the film for polishing above a plurality of dummy patterns as well as raised sections 211 thereof above first element formation regions (adjacent element formation regions) to a horizontally projected area of the first region (adjacent region) 200 may have a prescribed value.

Hereat, the total sum of top surface areas for raised sections 209 of the film for polishing above a plurality of dummy patterns as well as raised sections 211 thereof above first element formation regions (adjacent element formation regions) is greater than the total sum of top surface areas for a plurality of dummy patterns 203 as well as first element formation regions (adjacent element formation regions) 204.

A method of designing a top surface area of a dummy pattern and a width of a first trench is described in detail below.

EXAMPLES

Figure 3:
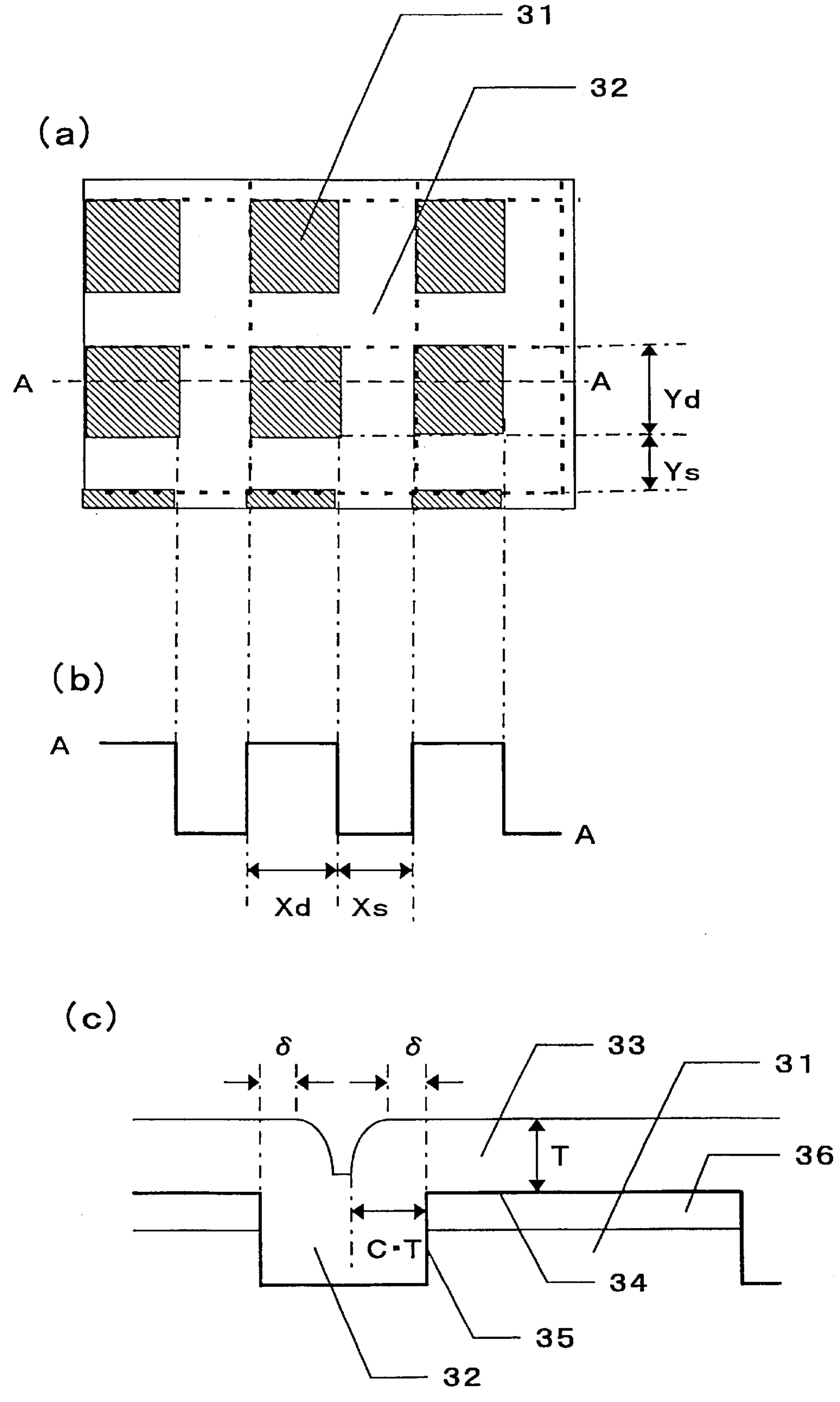
FIG. 3 is a schematic plan view and schematic cross-sectional views in explaining dummy patterns according to the present invention.

In an element isolation region within an adjacent region, partitioned by a plurality of first trenches 32, a plurality of dummy patterns 31 are formed, as shown in FIG. 3(*a*). FIG. 3(*b*) is a cross-sectional view taken along the line AA of FIG. 3(*a*). Every dummy pattern has a plane figure of a rectangle with sides, Xd and Yd in length, respectively, and a top surface area of Ad=Xd×Yd. Further, the plane figure of every first trench is L-shaped with widths of Xs and Ys.

Now, when the ratio (the occupation density in the adjacent region) of the total sum of the top surface areas for a plurality of dummy patterns 31 and the top surface areas for adjacent element formation regions to a horizontally projected area of the adjacent region is denoted by P(%), P(%) is the summation of the ratio (the occupation density for dummy patterns) at which the total of the top surface areas for a plurality of dummy patterns 31 occupies the horizontally projected area of the adjacent region and the ratio (the occupation density for adjacent element formation regions) at which the total of the top surface areas for adjacent element formation regions occupies the horizontally projected area of the adjacent region and, thus, P(%) can be written as

*P*(%)=(the occupation density for dummy patterns)

+(the occupation density for adjacent element formation regions).

Further, (the occupation density for dummy patterns) is 100×(the total of the top surface areas for a plurality of dummy patterns)/(the horizontally projected area of the adjacent region), and (the horizontally projected area of the adjacent region) is (the horizontally projected area of the element isolation region)/[1−(the occupation density for adjacent element formation regions)/100] so that

*P*(%)=100

×[1−(the occupation density for adjacent element formation regions)/100]

×(the total of the top surface areas for a plurality of dummy patterns)

/(the horizontally projected area of the element isolation region)

+(the occupation density for adjacent element formation regions).

Therefore, when dummy patterns take the shape as shown in FIGS. 3(*a*) and (*b*),

*P*(%)=100

×[1−(the occupation density for adjacent element formation regions)/100]

$\times(Xd\times Yd)/[(Xd+Xs)\times(Yd+Ys)]$

+(the occupation density for adjacent element formation regions)(1).

Further, in the present invention, when a top surface area of the dummy pattern and widths of the trench partitioning dummy patterns are designed, not only the occupation density for dummy patterns and the occupation density for adjacent element formation regions but also, with the film for polishing 33 formed as shown in FIG. 3(*c*), the occupation density of the film for polishing at the beginning of the polishing are taken into consideration.

In the case of FIG. 3(*c*), the film for polishing 33 is formed so as to have a film thickness T in the direction normal to the top surface 34 of the dummy pattern 31, and, hereat, the film for polishing becomes grown to a thickness of C·T in the direction normal to a sidewall 35 within a first trench 31. As a result, the deposition of the film for polishing 33 spreads out by δ, in the horizontal direction, with respect to the top surface 34 of the underlying dummy pattern 31. Further, C, referred to as the coverage, indicates the ration of the film thickness in the direction perpendicular to the depositing direction of the film for polishing to the film thickness in the depositing direction.

Meanwhile, when the ratio (the occupation density of the film for polishing in the adjacent region) of the total sum of the top surface areas for raised sections of the film for polishing above a plurality of dummy patterns and the top surface areas for raised sections of the film for polishing above adjacent element formation regions to a horizontally projected area of the adjacent region is denoted by Q(%), Q(%) is the summation of the ratio (the occupation density of the film for polishing above dummy patterns) at which the total of the top surface areas for raised sections of the film for polishing above a plurality of dummy patterns occupies the horizontally projected area of the adjacent region and the ratio (the occupation density of the film for polishing above adjacent element formation regions) at which the total of the top surface areas for raised sections of the film for polishing above adjacent element formation regions occupies the horizontally projected area of the adjacent region and, thus, Q(%) can be written as

*Q*(%)=(the occupation density of the film for polishing above dummy patterns)+(the occupation density of the film for polishing above adjacent element formation regions).

Further, (the occupation density of the film for polishing above dummy patterns) is 100×(the total of the top surface areas for raised sections of the film for polishing above a plurality of dummy patterns)/(the horizontally projected area of the adjacent region), so that, in the same manner as for P(%), Q(%) turns out to be

*Q*(%)=100

×[1−(the occupation density for adjacent element formation regions)/100]

×(the total of the top surface areas for raised sections of the film for polishing above a plurality of dummy patterns)

/(the horizontally projected area of the element isolation region)

+(the occupation density of the film for polishing above adjacent element formation regions).

Therefore, when the film for polishing takes the shape as shown in FIG. 3(*c*),

*Q*(%)=100

×[1−(the occupation density for adjacent element formation regions)/100]

$\times(Xd+2\delta)\times(Yd+2\delta)/[(Xd+Xs)\times(Yd+Ys)]$

+(the occupation density of the film for polishing above adjacent element formation regions).

Further, as δ can be generally considered as δ=C×T, Q(%) may be expressed as follows:

$$Q(\%)=100 \times[1-(\text{the occupation density for adjacent element formation regions})/100] \times(Xd+2C\cdot T)\times(Yd+2C\cdot T)/[(Xd+Xs)\times(Yd+Ys)] +(\text{the occupation density of the film for polishing above adjacent element formation regions}) \quad (2).$$

Here, the width of second trenches partitioning memory cell regions is set to be 0.1–0.5 μm, and the occupation density for adjacent element formation region, 10%. The film thickness T and the coverage C of the film for polishing are set to be 0.6 μm and 80%, respectively, and the occupation density of the film for polishing above adjacent element formation regions is set to be 12%.

Further, as an example, P(%) is assumed to take 54%. In addition, Q(%) is to take such a prescribed value as to make a difference between the occupation density of the film for polishing above the memory cell region and the occupation density of the film for polishing above the adjacent region small. Now, let Q (%) take a prescribed value of 70%. With these substitutions, Equations (1) and (2) become $$0.54=0.9\times(Xd\times Yd)/[(Xd+Xs)\times(Yd+Ys)]+0.1 \quad (3)$$

$$0.70=0.9\times(Xd+0.96)\times(Yd+0.96)/[(Xd+Xs)\times(Yd+Ys)]+0.12 \quad (4),$$

respectively.

If the plane figure of the dummy patterns is a square, on solving Equations (3) and (4), Xd=Yd=6 μm, Xs=Ys=3 μm are obtained. That is, there is designed a layout for the element formation region where square dummy patterns with a side of 6 μm are formed with an interval of 3 μm.

Case for Comparison

In a semiconductor substrate having the same layouts for a memory cell region and adjacent element formation regions as Example, square dummy patterns with a side of 28 μm are formed with an interval of 12 μm (Xd=Yd=28 μm, Xs=Ys=12 μm) in an element isolation region so as to make the occupation density P(%) in the adjacent region 54%, the same as Example.

Examination of Example with Case for Comparison

Figure 5:
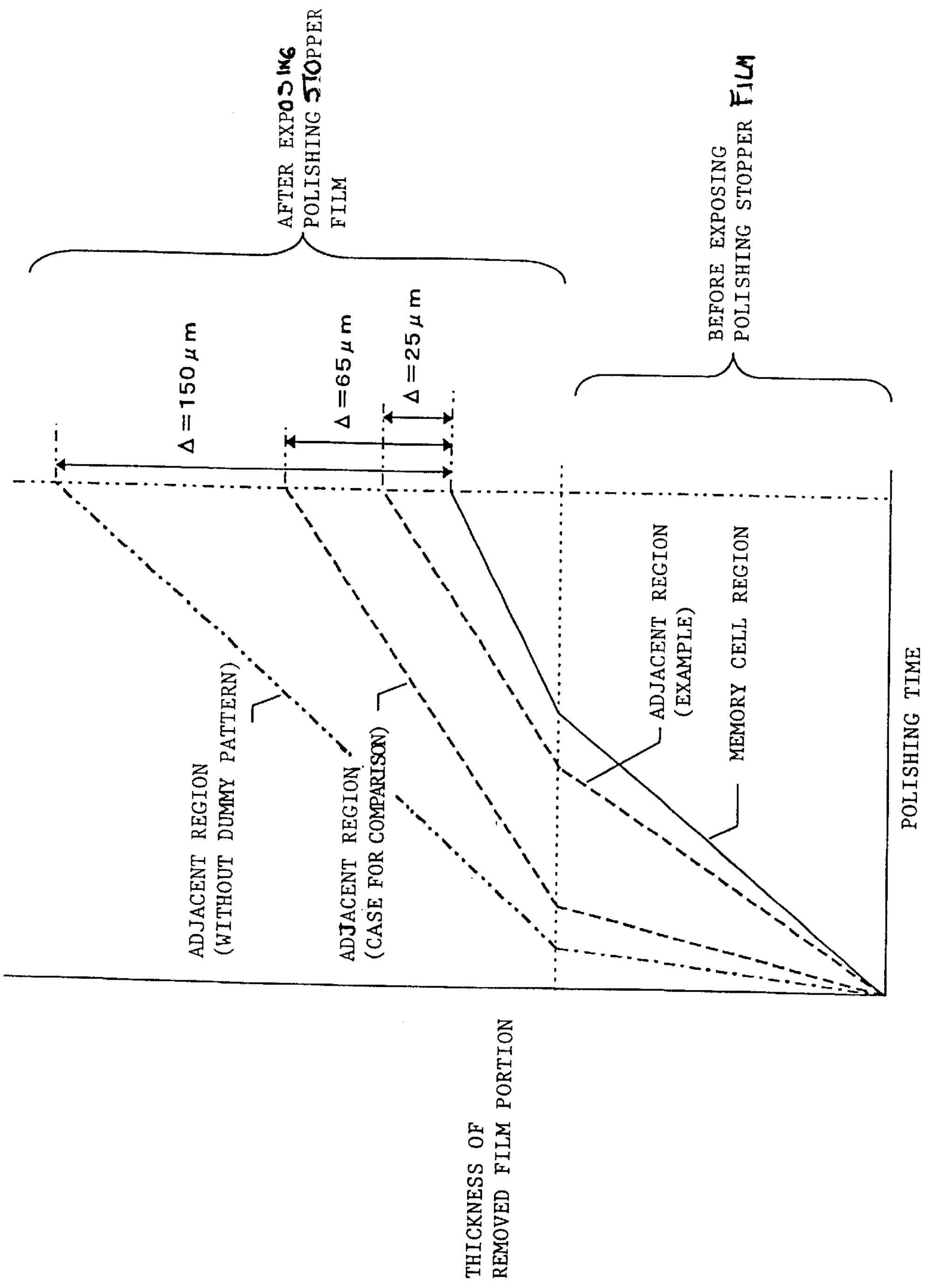
FIG. 5 is a schematic diagram in explaining the polishing manner of the CMP.
Figure 6:
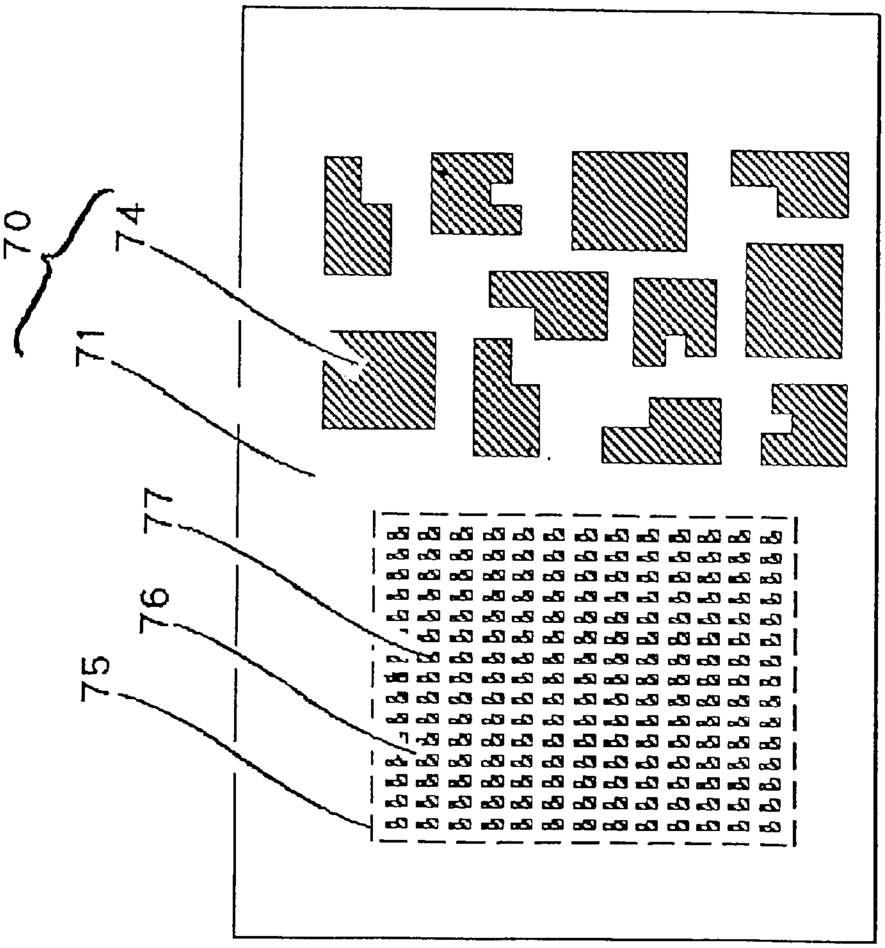
FIG. 6 is a schematic plan view in explaining a conventional semiconductor device.
Figure 7:
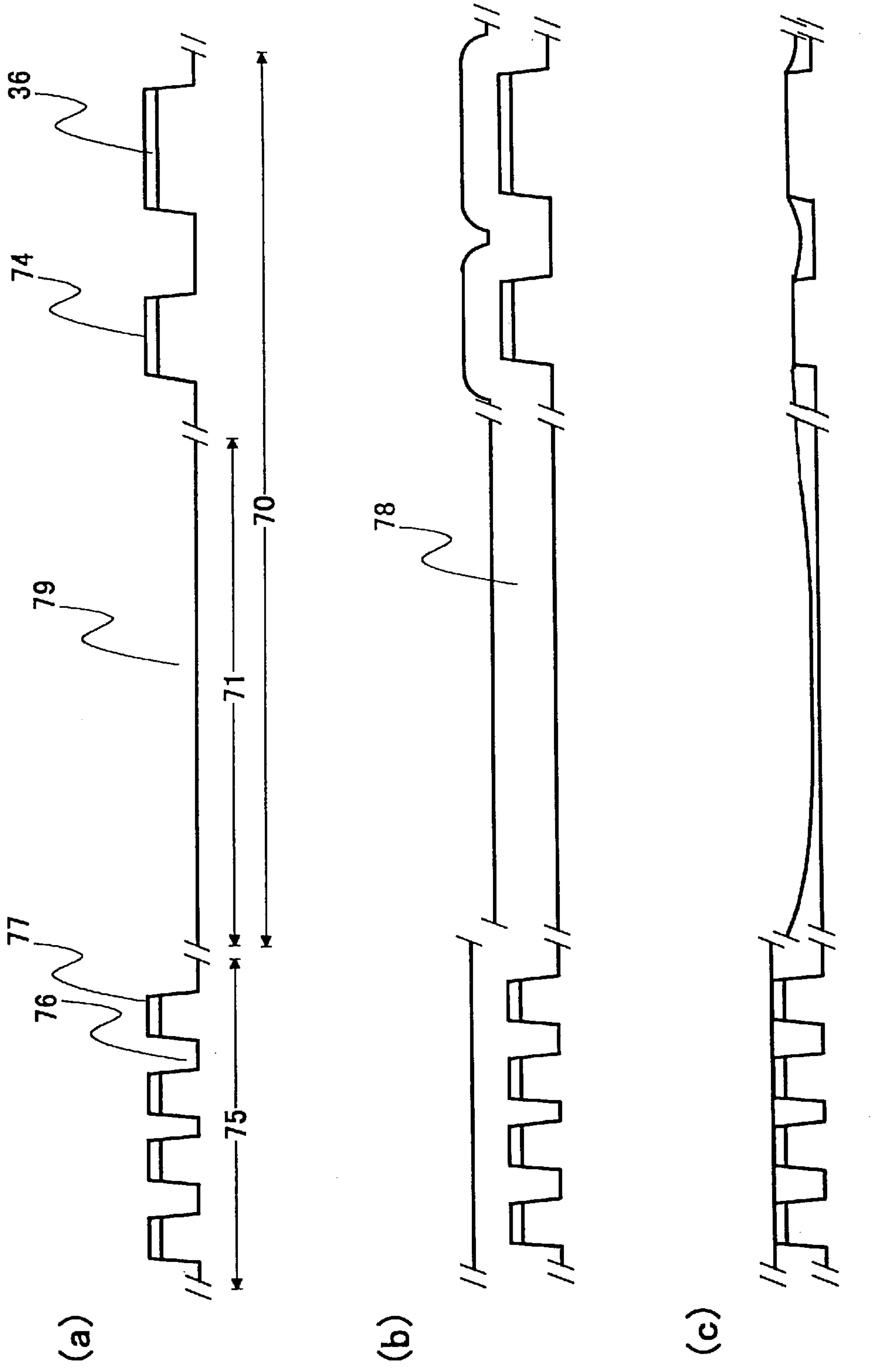
FIG. 7 is a series of schematic cross-sectional views illustrating the steps of a method of manufacturing a conventional semiconductor substrate.
Figure 8:
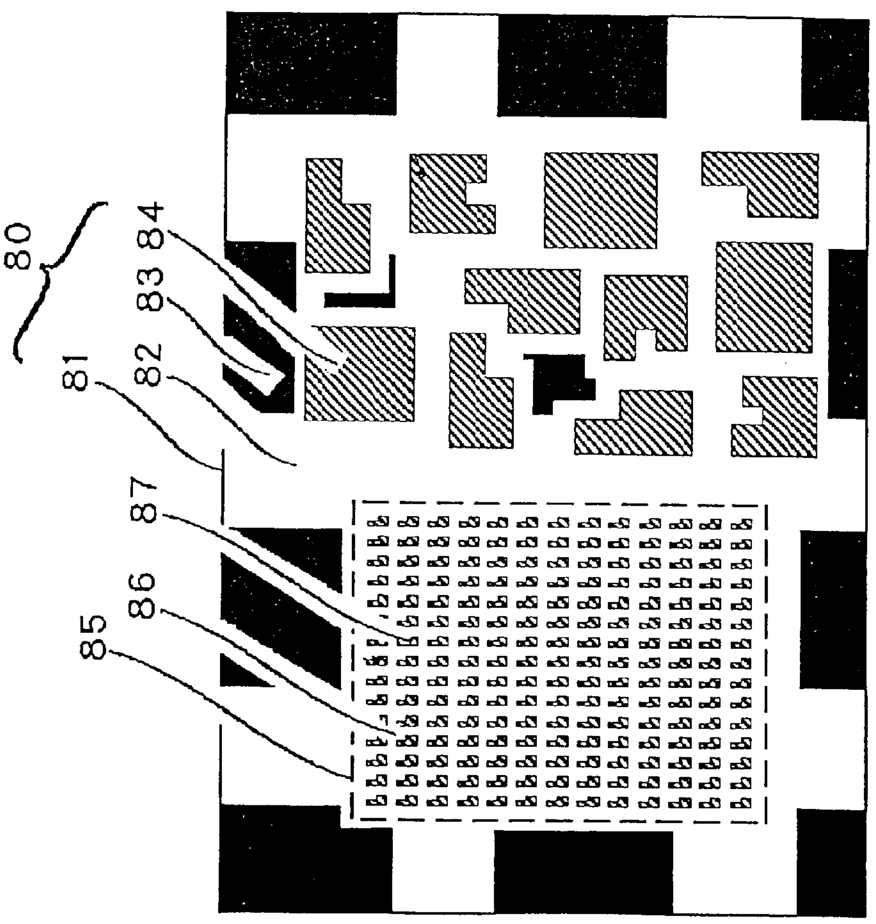
FIG. 8 is a schematic plan view in explaining another conventional semiconductor device.
Figure 9:
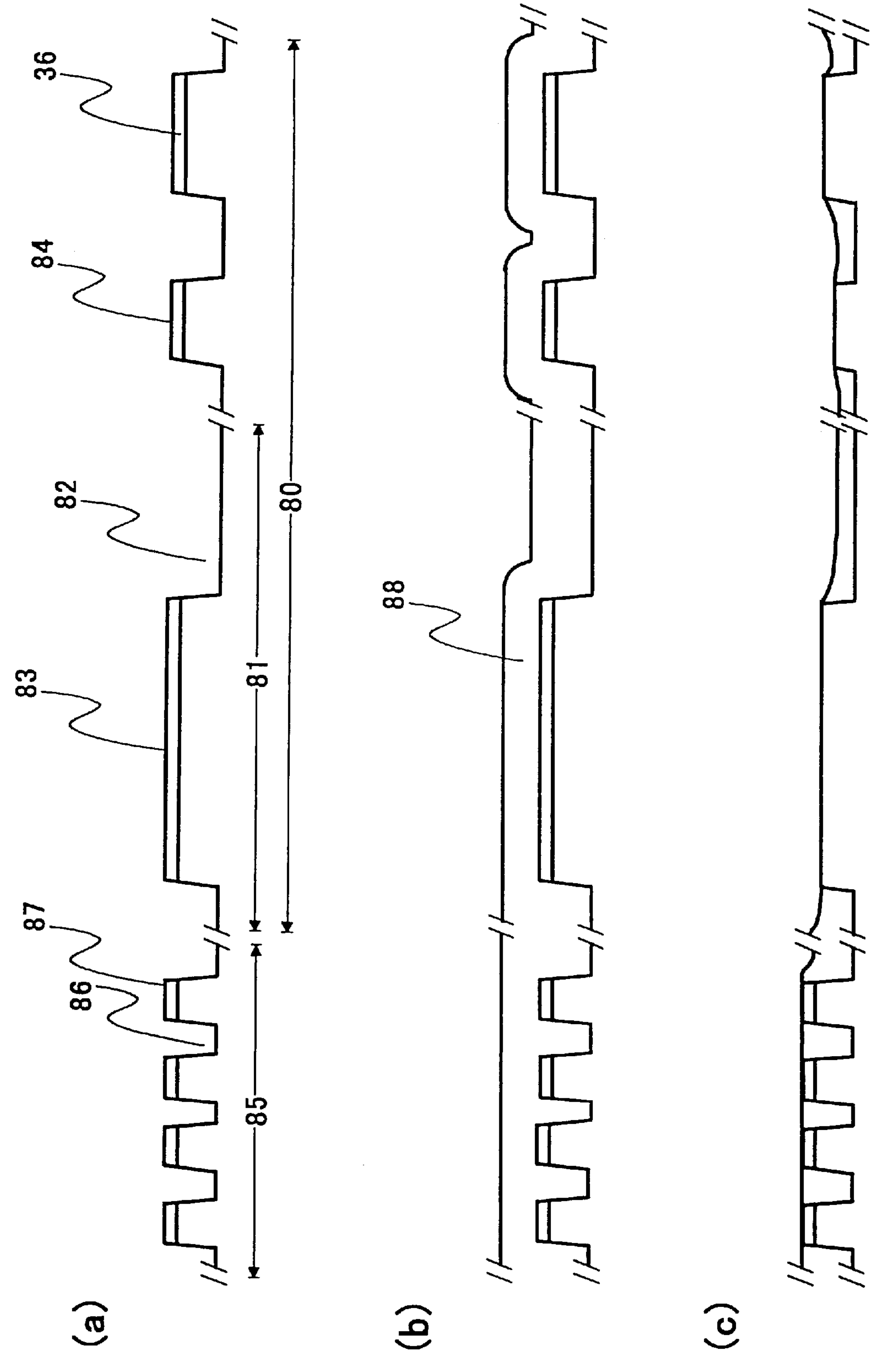
FIG. 9 is a series of schematic cross-sectional views illustrating the steps of a method of manufacturing a conventional semiconductor substrate.

FIG. 5 shows changes with time in thickness of the removed film portion made by polishing before and after a polishing stopper film is exposed, for semiconductor substrates having dummy patterns designed either by the above Example or Case for Comparison, which are each provided with a polishing stopper film and subjected to polishing. In FIG. 5, the solid line schematically presents the progress of the CMP in the memory cell region; the chain double-dashed line, that in the adjacent region in the absence of dummy patterns; and the dashed lines, those in the adjacent region with dummy patterns shown in Example and Case for Comparison, respectively. As the CMP proceeds, the thickness of the removed portion of the film for polishing increases. After the polishing stopper film is exposed, the CMP is further performed for a prescribed time period as circumstances require, and then the polishing is terminated.

In the CMP before exposing the polishing stopper film, because the occupation density of the film for polishing above the adjacent region is equal to or lower than the occupation density of the film for polishing above the memory cell region, the polishing rate in the adjacent region becomes equal to or higher than the polishing rate in the memory cell region. Further, in the CMP after exposing the polishing stopper film, because the occupation density in the adjacent region is equal to or lower than the occupation density in the memory cell region, the polishing rate in the adjacent region also becomes equal to or higher than the polishing rate in the memory cell region.

Now, if dummy patterns are formed in the element isolation region within the adjacent region, the occupation density in the adjacent region as well as the occupation density of the film for polishing above the adjacent region increase so that the polishing rates in the adjacent region before and after exposing the polishing stopper film decrease, indicated in FIG. 5 as a change from the chain double-dashed line to the dashed lines.

Next, comparisons made between two cases in which dummy patterns described in Example and Case for Comparison are respectively formed are described below. Since the occupation densities for dummy patterns in two cases are the same, the polishing rates in the adjacent region after exposing the polishing stopper film become almost the same. Against this, at the beginning of the polishing, the occupation density of the film for polishing above the adjacent region in Example is greater than that in Case for Comparison and rather close to the occupation density of the film for polishing above the memory cell region. Therefore, by designing dummy patterns as Example, a deviation between polishing in the adjacent region and that in the memory cell region in the CMP can be suppressed. As a result, in completion of the CMP, the substrate surface can attain a high planarity.

In contrast with this, in Case for Comparison, the occupation density Q(%) of the film for polishing in the adjacent region is not taken into consideration at all, at the time of dummy pattern design. Therefore, while Q(%) in Example is set to be 70%, Q(%) in Case for Comparison obtained by substituting Xd=Yd=28 μm, Xs=Ys=12 μm into Equation (2), becomes Q=59%. As a result, in Case for Comparison, the occupation density of the film for polishing above the adjacent region becomes smaller than the occupation density of the film for polishing above the memory cell region so that a deviation of polishing between these regions becomes considerably large, which leads to an unsatisfactory planarity of the polished surface in completion of the CMP.

Further, the total amount of polishing at the end of polishing in the above region increases in the order of the memory cell region, the adjacent region with dummy patterns of Example being formed, the adjacent region with dummy patterns of Case for Comparison being formed and the adjacent region in the absence of dummy patterns. Consequently, the difference in polishing amount (Δ in FIG. 5) at the end of polishing between the adjacent region and the memory cell region increases in the order of the case with dummy patterns of Example being formed, the case with dummy patterns of Case for Comparison being formed and the case in the absence of dummy patterns.

Herein, to suppress a deviation of polishing between the adjacent region and the memory cell region, it is preferable to make Δ as small as possible. Specifically, Δ is made preferably not greater than 10% of the film thickness of the film for polishing and more preferably not greater than 5% thereof. If the difference in polishing amount between the adjacent region and the memory cell region is not greater than 10% of the film thickness of the film for polishing, the non-planarity after completing the CMP is kept within 10% of the deposition accuracy, which indicates the planarity thereat is satisfactorily high.

For example, when a non-doped silicon glass (referred to as NSG hereinafter) with a thickness of 600 nm is fabricated as a film for polishing, Δ becomes 150 nm in the absence of dummy patterns. Against this, for Case for Comparison, Δ becomes 65 nm. However, when the NSG has a film thickness of 600 nm, Δ is preferably not greater than 60 nm and more preferably not greater than 30 nm. In the case of Example, Δ becomes 25 nm, which provides excellent planarity.

The above description well demonstrates that, in order to attain satisfactorily flat polished surface in completion of the CMP, it is required to consider not only the occupation density in the adjacent region but also the occupation density of the film for polishing above the adjacent region for designing dummy patterns.

Further, it is generally preferable to set the occupation density of the film for polishing in the adjacent region higher. The reason lies in the fact that, with increasing occupation density of the film for polishing, the portion of the horizontally projected area of the film for polishing that is to be polished in the adjacent region increases and, thus, the polishing rate in this region decreases. Consequently, dishing, erosion and the like may be prevented from occurring in the adjacent region, and highly flat polished surface can be attained in completion of the CMP. From this viewpoint, the occupation density of the film for polishing in the adjacent region is set to be preferably not less than 60%, more preferably not less than 65%, and still more preferably not less than 70%.

Moreover, as the occupation density of the film for polishing in the adjacent region increases, the horizontally projected area of the film for polishing in the adjacent region approaches that in the memory cell region, which suppresses a deviation in polishing.

Further, when the width of the second trenches partitioning the memory cell formation regions is as sufficiently narrow as 0.1–0.5 μm or so, the neighboring extended portions of the film for polishing come into contact with each other over the second trenches so that the top surfaces of the film for polishing above the memory cell region become almost plane-like and, in consequence, the ratio of the film for polishing above the memory cell region becomes nearly 100%. In such circumstances, if the occupation density of the film for polishing above the adjacent region is set to be large enough, say 80% or greater, there can be achieved a state in which the semiconductor substrate is nearly all covered with the film for polishing.

In such a case, it can be considered that a pseudo-layer for polishing with a large surface area is formed on the semiconductor substrate. When the CMP is performed under such a condition, it becomes very close to a state in which polishing is applied to a layer for polishing that is uniformly formed on a flat semiconductor substrate where no trenches or the likes are formed. As a result, the CMP can be conducted with a deviation in polishing rate between regions being well suppressed, and adverse effects such as dishing and erosion can be avoided.

Figure 4:
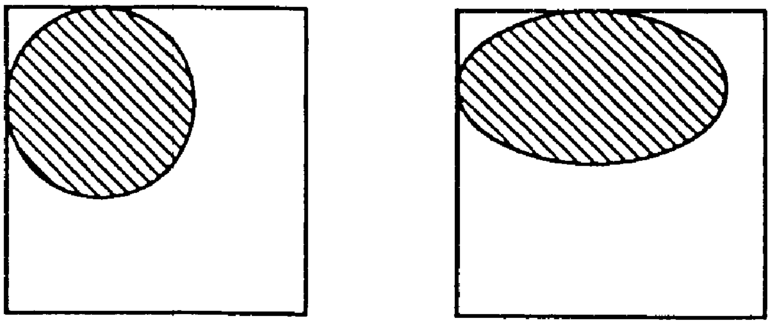
FIG. 4 is schematic plan view in explaining the plane figure of dummy patterns.
Figure 4:
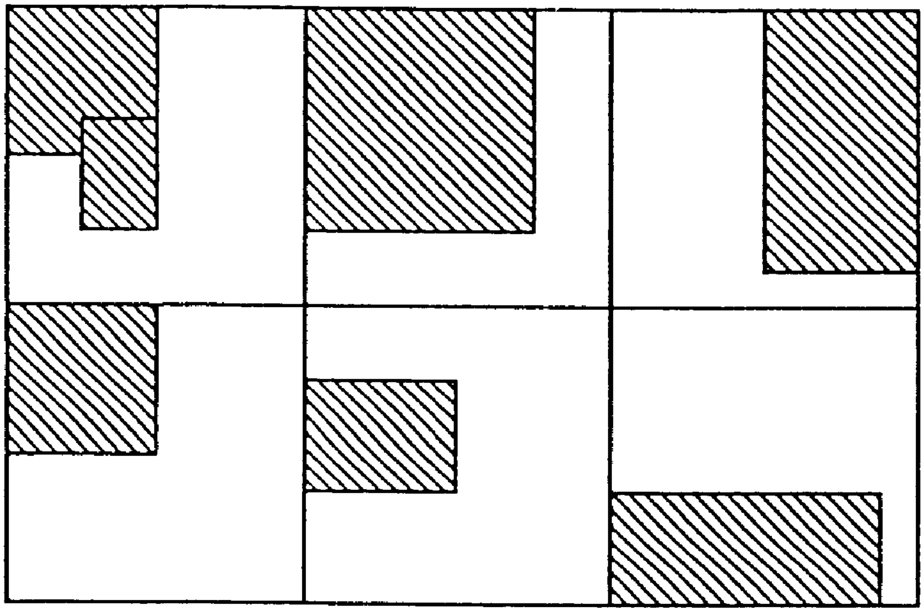

Further, while a rectangle and a square are shown as examples of the plane figure of dummy pattern in the above Modes, it is to be understood that the plane figure of dummy patterns is not particularly limited and may take the shape of a circle, an ellipse or the like, as shown in FIG. 4(*a*). Furthermore, it is also possible to form dummy patterns having different plane figures together, as shown in FIG. 4(*b*).

Further, as long as the design of dummy patterns are determined with the occupation density in the adjacent region as well as the occupation density of the film for polishing above the adjacent region considered, the width of trenches partitioning dummy patterns is not particularly limited. However, the width thereof is set to be preferably not less than 1 μm and more preferably not less than 2 μm, but preferably not greater than 30 μm and more preferably not greater than 15 μm. This can be explained as follows. That is, under these conditions, the width of the trenches partitioning dummy patterns becomes greater than the width of the trenches partitioning the memory cell formation regions (for example, 0.1–0.5 μm) so that dummy patterns have less minute nature than memory cell regions. In this way, the amount of data to be dealt with in reticle fabrication can be prevented from unduly increasing.

Further, the depth of trenches are, in general, set to be 0.2–0.5 μm.

In practice, when dummy patterns are fabricated on a Si substrate, as shown in FIG. 2 and FIG. 3(*c*), there is formed a Si nitride film or the like that is to function as a polishing stopper film 36. Examples of a method of forming the Si nitride film include the thermal nitridation method, the low pressure CVD (Chemical vapour Deposition) method, the atmospheric CVD method, the plasma enhanced CVD method and the high density plasma enhanced CVD method. For the source gas, $SiH_2Cl_2$, $NH_3$, $SiH_4NH_3$, $N_2O$ or the like may be employed.

Further, with respect to the STI, in particular, as an example of a film for polishing 33, there can be given a non-doped silicon glass layer (referred to as a NSG hereinafter). The NSG may be fabricated by the low pressure CVD method, the atmospheric CVD method or the like, and for the source gas, $SiH_4$, $Si(OC_2H_5)_4$, $O_2$, $O_3$ or the like may be utilized. Among these, it is preferable to employ the low pressure CVD method, due to its capability to form NSG of high quality. In the case of the low pressure CVD method, using $Si(OC_2H_5)_4$ and $O_2$ as the source gases, a NSG is formed at a substrate temperature of approximately 700° C., for example, under the condition that the coverage is 20–100%, to a thickness of 300–900 nm.

Although the present invention is so far described using the method of fabricating the buried trench structure (STI) filled with an insulating material, it will be obvious to those skilled in the art that the present invention is not limited to this, and may be applied to the fabrication methods of other buried trench structures such as the buried aluminium-based interconnection and buried copper-based interconnection.

What is claimed is:

1. A method of manufacturing a semiconductor device; which comprises the steps of:

forming a plurality of first trenches in a first region on a semiconductor substrate and thereby forming a plurality of dummy patterns that are partitioned by a plurality of said first trenches;

forming a film for polishing at least on said first region so as to provide raised sections above a plurality of said dummy patterns and sunken sections above a plurality of said first trenches; and removing said film for polishing that overlies a plurality of said dummy patterns by means of polishing so that said film for polishing may remain inside of a plurality of said first trenches; wherein:

a top surface area for a plurality of said dummy patterns and a width for a plurality of said first trenches are set on the basis of a ratio of a total top surface area for raised sections of said film for polishing to a horizontally projected area of said first region.

2. A method of manufacturing a semiconductor device according to claim 1, wherein the total top surface area for raised sections of said film for polishing is greater than a total top surface area for a plurality of said dummy patterns.

3. A method of manufacturing a semiconductor device according to claim 1, wherein said film for polishing is made of non-doped silicon glass.

4. A method of manufacturing a semiconductor device according to claim 1, wherein said semiconductor device has, within said first region, a first element formation region partitioned by an element isolation region, and a plurality of said dummy patterns are formed in said element isolation region.

5. A method of manufacturing a semiconductor device according to claim 4, wherein said film for polishing has a raised section also above said first element formation region, and a top surface area for a plurality of said dummy patterns and a width for a plurality of said first trenches are set on the basis of a ratio of a total top surface area for raised sections of said film for polishing above a plurality of dummy patterns as well as raised sections thereof above said first element formation region to a horizontally projected area of said first region.

6. A method of manufacturing a semiconductor device according to claim 5, wherein the total top surface area for raised sections of said film for polishing above a plurality of said dummy patterns as well as raised sections thereof above said first element formation region is greater than a total top surface area for a plurality of said dummy patterns as well as said first element formation region.

7. A method of manufacturing a semiconductor device according to claim 1, wherein:

said semiconductor device has, in a second region differing from said first region, a plurality of second trenches with a smaller width than a plurality of said first trenches as well as a plurality of second element formation regions partitioned by a plurality of said second trenches; and said film for polishing is formed also on said second region and a top surface of said film for polishing laid on said second region is substantially flat.

8. A method of manufacturing a semiconductor device comprising a memory cell region and an adjacent region which has an adjacent element formation region partitioned by an element isolation region; which comprises the steps of:

forming a plurality of dummy patterns partitioned by a plurality of first trenches and a plurality of memory cell formation regions partitioned by a plurality of second trenches with a smaller width than a plurality of said first trenches, in said element isolation region and in said memory cell region, respectively;

forming a film for polishing on said adjacent region and said memory cell region so as to provide raised sections above a plurality of said dummy patterns as well as said adjacent element formation region, and provide sunken sections above a plurality of said first trenches; and removing said film for polishing that overlies said adjacent region and said memory cell region by means of polishing so that said film for polishing may remain inside of a plurality of said first trenches as well as inside of a plurality of said second trenches; wherein:

a top surface area for a plurality of said dummy patterns and a width for a plurality of said first trenches are set on the basis of a ratio of a total top surface area for raised sections of said film for polishing above a plurality of dummy patterns as well as raised sections thereof above said adjacent element formation region to a horizontally projected area of said adjacent region.

9. A method of manufacturing a semiconductor device according to claim 8, wherein the total top surface area for raised sections of said film for polishing above a plurality of said dummy patterns as well as raised sections thereof above said adjacent element formation region is greater than a total top surface area for a plurality of said dummy patterns as well as adjacent element formation region.

10. A method of manufacturing a semiconductor device according to claim 8, wherein said film for polishing is made of non-doped silicon glass.

11. A method of manufacturing a semiconductor device according to claim 8, wherein a top surface of said film for polishing laid on said memory cell region is substantially flat.

12. A method of manufacturing a semiconductor device according to claim 8, wherein a ratio of a total top surface area for raised sections of said film for polishing above a plurality of dummy patterns as well as raised sections thereof above said adjacent element formation region to a horizontally projected area of said adjacent region is not less than 60%.

13. A method of designing a semiconductor device; which is manufactured by a method comprising the steps of:

forming a plurality of first trenches in a first region on a semiconductor substrate and thereby forming a plurality of dummy patterns that are partitioned by a plurality of said first trenches;

forming a film for polishing at least on said first region so as to provide raised sections above a plurality of said dummy patterns and sunken sections above a plurality of said first trenches; and removing said film for polishing that overlies a plurality of said dummy patterns by means of polishing so that said film for polishing may remain inside of a plurality of said first trenches; wherein:

a top surface area for a plurality of said dummy patterns and a width for a plurality of said first trenches are set on the basis of a ratio of a total top surface area for raised sections of said film for polishing to a horizontally projected area of said first region.

* * * * *